United States Patent
Lee et al.

(10) Patent No.: US 11,921,421 B2
(45) Date of Patent: *Mar. 5, 2024

(54) OVERLAY CORRECTING METHOD, AND PHOTOLITHOGRAPHY METHOD, SEMICONDUCTOR DEVICE MANUFACTURING METHOD AND SCANNER SYSTEM BASED ON THE OVERLAY CORRECTING METHOD

(71) Applicant: Samsung Electronics Co., Ltd., Suwon-si (KR)

(72) Inventors: Jeongjin Lee, Hwaseong-si (KR); Minseok Kang, Hwaseong-si (KR); Seungyoon Lee, Seoul (KR); Chan Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/062,231

(22) Filed: Dec. 6, 2022

(65) Prior Publication Data

US 2023/0095808 A1    Mar. 30, 2023

Related U.S. Application Data

(63) Continuation of application No. 16/807,734, filed on Mar. 3, 2020, now Pat. No. 11,537,042.

(30) Foreign Application Priority Data

Jul. 10, 2019   (KR) .................... 10-2019-0083433

(51) Int. Cl.
*G03F 1/70* (2012.01)
*G03F 7/20* (2006.01)
(Continued)

(52) U.S. Cl.
CPC .............. *G03F 1/70* (2013.01); *G03F 7/2004* (2013.01); *G06F 17/18* (2013.01); *H01L 22/12* (2013.01)

(58) Field of Classification Search
CPC ...... G03F 1/70; G03F 7/2004; G03F 7/70258; G03F 7/705; G03F 7/70633;
(Continued)

(56) References Cited

U.S. PATENT DOCUMENTS 6,960,414 B2   11/2005   Park et al.
8,117,001 B2    2/2012   Lee et al.
(Continued)

FOREIGN PATENT DOCUMENTS

KR         100416618 B1    2/2004
KR       20060055112 B1   12/2006
(Continued)

*Primary Examiner* — Stacy Whitmore
(74) *Attorney, Agent, or Firm* — Myers Bigel, P.A.

(57) ABSTRACT

An overlay correcting method capable of optimizing correction of an overlay within a scanner correction limit of a scanner of a scanner system, and a photolithography method, a semiconductor device manufacturing method and the scanner system which are based on the overlay correcting method are provided. The overlay correcting method includes collecting overlay data by measuring an overlay of a pattern; calculating correction parameters of the overlay by performing regularized regression using the overlay data, the regularized regression being based on a correction limit of the scanner such that the correction parameters fall within the correction limit of the scanner; and providing the correction parameters to the scanner.

5 Claims, 15 Drawing Sheets

(51) Int. Cl.
*G06F 17/18* (2006.01)
*H01L 21/66* (2006.01)

(58) Field of Classification Search
CPC ............. G03F 7/70033; G03F 7/70508; G03F 7/70516; G06F 17/18; H01L 22/12; H01L 22/20
See application file for complete search history.

(56) References Cited

U.S. PATENT DOCUMENTS

| | | |
|---|---|---|
| 8,767,183 B2 | 7/2014 | Den Boef |
| 9,087,176 B1 | 7/2015 | Chang et al. |
| 10,295,993 B2 | 5/2019 | Choi et al. |
| 11,537,042 B2 * | 12/2022 | Lee .................. G03F 7/705 |
| 2008/0106714 A1 | 5/2008 | Okita |
| 2010/0112467 A1 | 5/2010 | Chung |
| 2016/0163033 A1 | 6/2016 | Vukkadala et al. |
| 2017/0227851 A1 | 8/2017 | Lai et al. |
| 2018/0196357 A1 | 7/2018 | Middlebrooks et al. |
| 2018/0330999 A1 | 11/2018 | Lee et al. |
| 2020/0124975 A1 | 4/2020 | Lee et al. |
| 2020/0175533 A1 | 6/2020 | Moore et al. |
| 2020/0264513 A1 | 8/2020 | Yamamoto et al. |
| 2020/0265330 A1 | 8/2020 | Ishikawa |
| 2021/0002698 A1 | 1/2021 | Kang et al. |

FOREIGN PATENT DOCUMENTS

| | | |
|---|---|---|
| KR | 101395733 B1 | 5/2014 |
| KR | 20140076562 B1 | 12/2014 |
| KR | 20160130243 | 11/2016 |
| WO | 2018033363 A1 | 2/2018 |

* cited by examiner

FIG. 2B
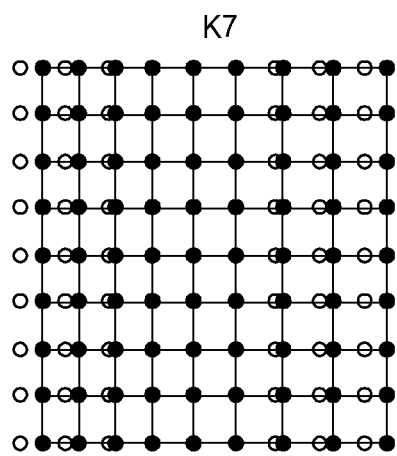
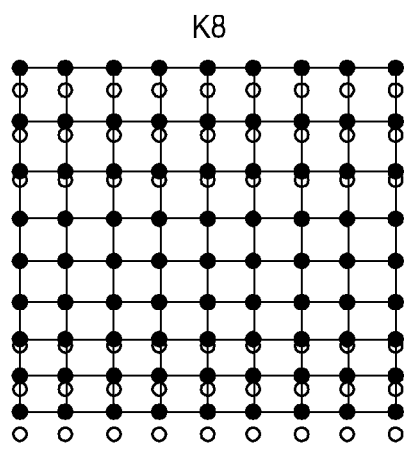
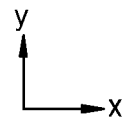
FIG. 2C
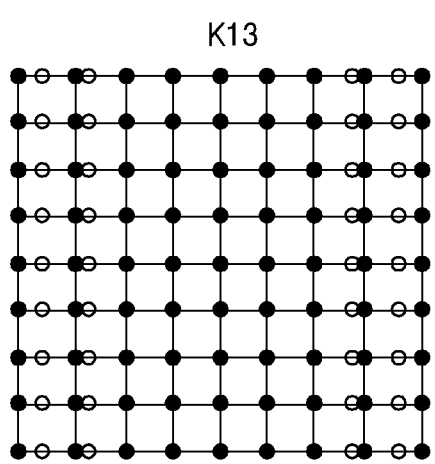
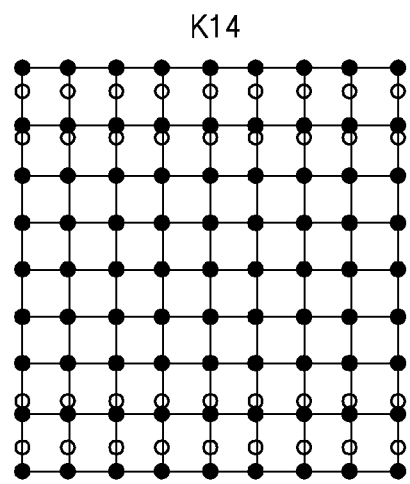
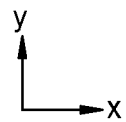

Underfitting

Just right

Overfitting

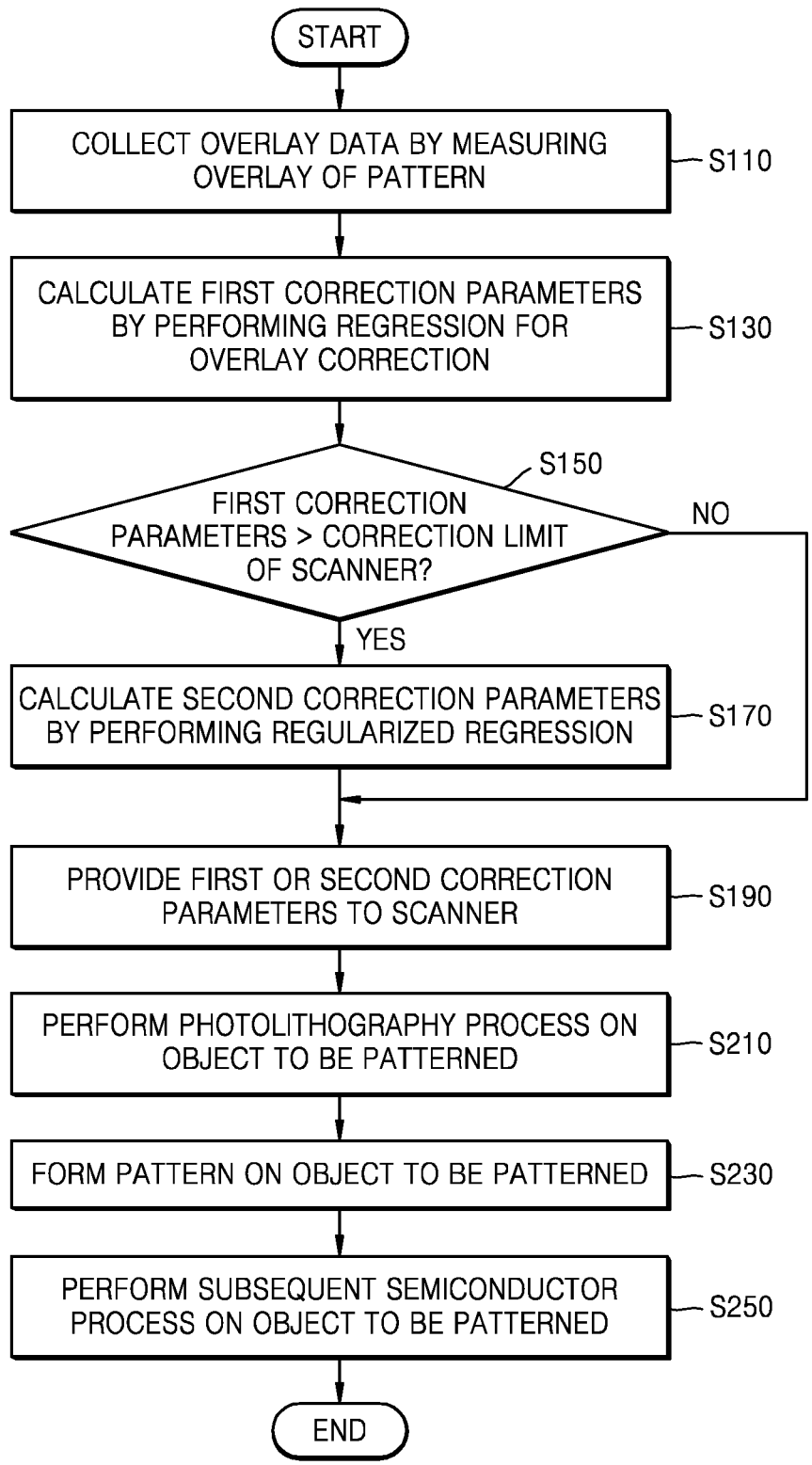

OVERLAY CORRECTING METHOD, AND PHOTOLITHOGRAPHY METHOD, SEMICONDUCTOR DEVICE MANUFACTURING METHOD AND SCANNER SYSTEM BASED ON THE OVERLAY CORRECTING METHOD

CROSS-REFERENCE TO RELATED APPLICATION

This application is a continuation of U.S. application Ser. No. 16/807,734, filed Mar. 3, 2020, which claims the benefit of Korean Patent Application No. 10-2019-0083433, filed on Jul. 10, 2019, in the Korean Intellectual Property Office, the disclosures of which are incorporated herein in their entirety by reference.

BACKGROUND

The inventive concepts relate to an overlay correcting method, and more particularly, to an overlay correcting method using regression, and a photolithography method, a semiconductor device manufacturing method and a scanner system which are based on the overlay correcting method.

As line widths of semiconductor circuits have become finer, light sources of shorter wavelengths have been used. For example, extreme ultra-violet (EUV) has been used as an exposure light source. Due to absorption characteristics of EUV, a reflective EUV mask is generally used in an EUV exposure process. Mirrors may be included in an illumination optical system for transmitting EUV to an EUV mask and/or in a projection optical system for projecting the EUV reflected from the EUV mask to an object to be exposed. As the exposure process becomes more difficult or complex, an overlay error may occur between patterns of different layers on an object (e.g., a wafer) to be patterned due to the EUV mask, an optical system, a stage, or the like.

SUMMARY

The inventive concepts provide an overlay correcting method capable of improving or optimizing correction of an overlay within a scanner correction limit of a scanner system, and a photolithography method, a semiconductor device manufacturing method and a scanner system which are based on the overlay correcting method.

According to an aspect of the inventive concepts, an overlay correcting method includes collecting overlay data by measuring an overlay of a pattern; calculating correction parameters of the overlay by performing regularized regression using the overlay data, wherein the regularized regression is based on a correction limit of a scanner such that the correction parameters fall within the correction limit of the scanner; and providing the correction parameters to the scanner.

According to another aspect of the inventive concepts, an overlay correcting method includes collecting overlay data by measuring an overlay of a pattern; calculating first correction parameters by performing a first regression using the overlay data; determining whether the first correction parameters are greater than a correction limit of a scanner; calculating second correction parameters by performing ridge regression responsive to determining that at least one of the first correction parameters is greater than the correction limit of the scanner, the second correction parameters equal to or less than the correction limit of the scanner; and providing the second correction parameters to the scanner.

According to another aspect of the inventive concepts, a photolithography method includes collecting overlay data by measuring an overlay of a pattern; calculating first correction parameters by performing a first regression using the overlay data; determining whether the first correction parameters are greater than a correction limit of a scanner; calculating second correction parameters by performing regularized regression responsive to determining that at least one of the first correction parameters is greater than the correction limit of the scanner, the second correction parameters equal to or less than the correction limit of the scanner; providing the second correction parameters to the scanner; and performing, by the scanner, a photolithography process on an object to be patterned, based on the second correction parameters.

According to another aspect of the inventive concepts, a semiconductor device manufacturing method includes collecting overlay data by measuring an overlay of a pattern; calculating first correction parameters by performing a first regression using the overlay data; determining whether the first correction parameters are greater than a correction limit of a scanner; calculating second correction parameters by performing regularized regression responsive to determining that at least one of the first correction parameters is greater than the correction limit of the scanner, the second correction parameters being equal to or less than the correction limit of the scanner; providing the second correction parameters to the scanner; performing, by the scanner, a photolithography process on an object to be patterned based on the second correction parameters, the object comprising a semiconductor material; forming a pattern on the object to be patterned; and performing a subsequent semiconductor process on the object to be patterned.

According to another aspect of the inventive concepts, a scanner system includes a correction parameter calculation device configured to calculate correction parameters of an overlay by regularized regression; and a scanner configured to perform a photolithography process on an object to be patterned, based on the correction parameters, wherein the regularized regression is based on a correction limit of the scanner.

BRIEF DESCRIPTION OF THE DRAWINGS

Embodiments of the inventive concepts will be more clearly understood from the following detailed description taken in conjunction with the accompanying drawings in which:

FIGS. 2A, 2B, and 2C are conceptual diagrams for explaining correction parameters of an overlay;

FIG. 9 is a flowchart of a semiconductor device manufacturing method according to an embodiment of the inventive concept.

DETAILED DESCRIPTION OF THE EMBODIMENTS

Figure 1A:
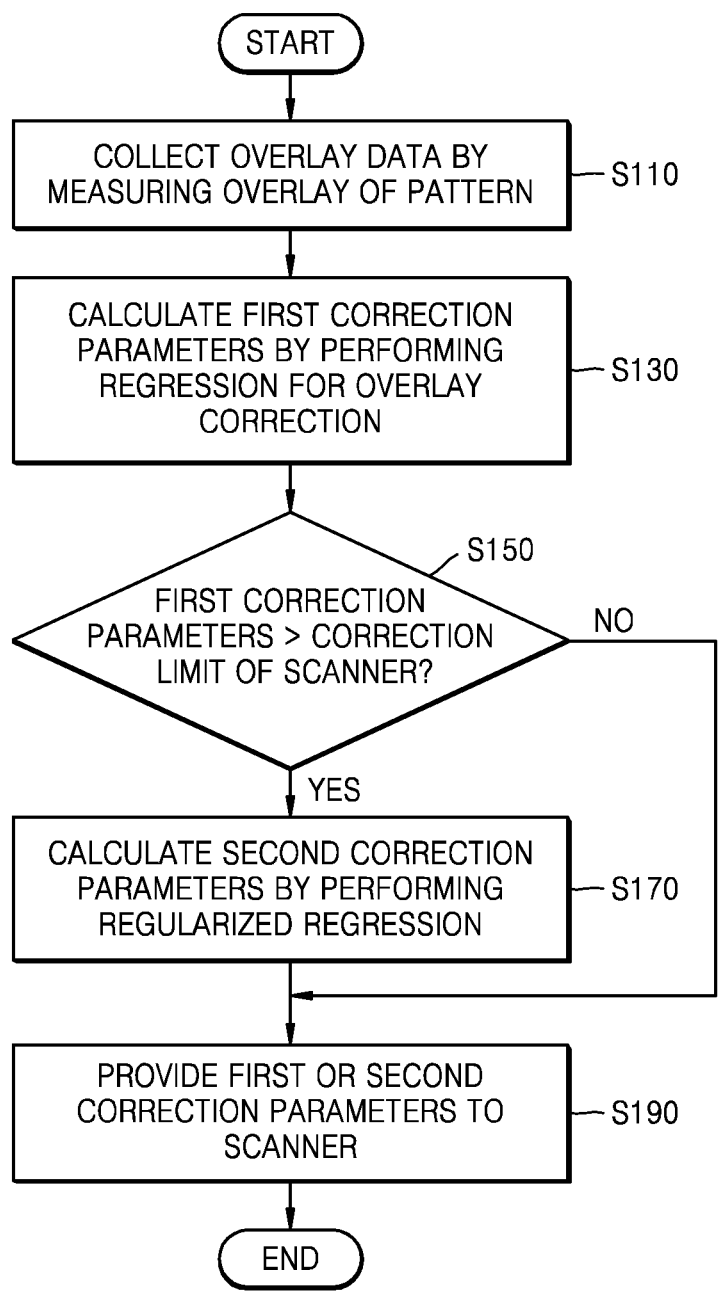
FIG. 1A is a flowchart of an overlay correcting method according to an embodiment of the inventive concepts.

Hereinafter, embodiments of the inventive concepts will be described in detail with reference to the accompanying drawings. The same elements are assigned the same reference numerals in the drawings and are not redundantly described herein.

Figure 1B:
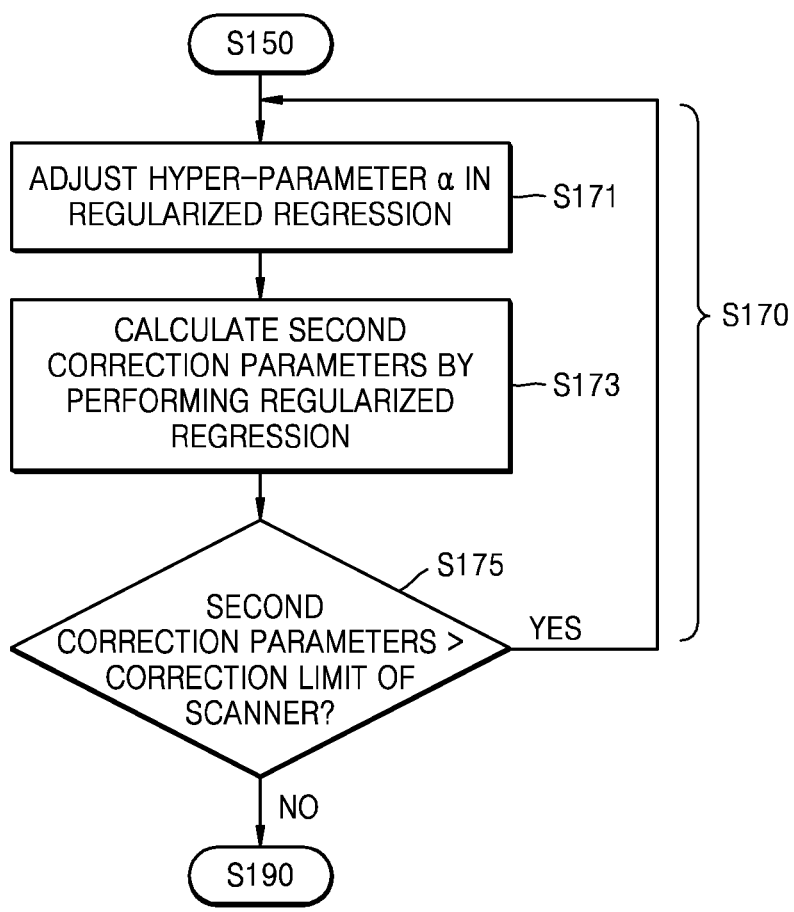
FIG. 1B is a flowchart illustrating in detail calculation of second correction parameters of FIG. 1A.

FIG. 1A is a flowchart of an overlay correcting method according to an embodiment of the inventive concepts. FIG. 1B is a flowchart illustrating calculating second correction parameters of FIG. 1A in detail. The terms first, second, etc. are used herein to distinguish elements, parameters, and/or operations from one another, rather than for purposes of limitation.

Referring to FIG. 1A, in the overlay correcting method of the present embodiment, first, overlay data is collected by measuring an overlay of a pattern (S110). Here, the overlay refers to a degree of overlap between a pattern of an under-layer and a pattern of an upper layer. Strictly speaking, the overlay refers to an overlay error but will be hereinafter referred to as an overlay for convenience of explanation. In general, an overlay can be reduced or minimized by performing a shot or pattern exposure to align with a lower layer as much as possible during an exposure process of an upper layer, based on an overlay mark or the like on the lower layer. Nevertheless, when an overlay is large, i.e., when a relative positional difference between a pattern of an under-layer and a pattern of a current layer is large, the performance of a semiconductor device may be adversely influenced and thus a defect may occur in the semiconductor device.

The overlay may be calculated by measuring a first overlay mark formed on the under-layer and a second overlay mark formed on the upper layer, and calculating a relative positional difference therebetween. An overlay mark may be formed on a scribe lane of a wafer in a box pattern form or a bar pattern form. However, a shape or position of forming the overlay mark is not limited to the above description.

Overlays may occur due to various causes. For example, a cause of an overlay may be based on a field error of a shot in a photolithography process performed by a scanner. An overlay based on a field error of a shot may be fixed by overlay control or overlay correction by the scanner performing the photolithography process. For example, the overlay correction of the scanner may be implemented by adjustment of a lens actuator in a stage or an optical system. In this way, overlay correction, i.e., field correction of a shot, in the photolithography process may be performed by overlay correction by the scanner.

For reference, the overlay correction of the scanner will be described in more detail. The overlay correction of the scanner may be performed through physical operation of the scanner. Here, the physical operation may refer to, but is not limited to, applying pressure on a lens, tilting the lens, or moving the lens quickly. In addition, the physical operation of the scanner for overlay correction may be understood to include moving or heating an object W to be patterned using a stage 240 (see FIG. 10B).

Overlay correction parameters may be variously classified. A scanner correction limit may vary depending on the overlay correction parameters. For example, in the case of an extreme ultraviolet (EUV) scanner, there may be overlay correction parameters K1 to K20 and a correction limit of the EUV scanner may be different with respect to the overlay correction parameters. In the EUV scanner, the number of overlay correction parameters is not limited to twenty. For example, in the EUV scanner, the number of overlay correction parameters may be greater than twenty. An overlay correcting method of the present embodiment is not limited to the EUV scanner and is also applicable to other types of scanners. For example, the overlay correcting method of the present embodiment is applicable to various types of scanners such as an immersion scanner and an extended scanner. The overlay correction parameters will be described in more detail in the description of FIGS. 3A to 3C below.

Next, regression for overlay correction is performed using the collected overlay data to calculate first correction parameters (S130). Regression or a regression analysis may refer to an analysis method of obtaining a model between two variables for a plurality of pieces of collected data and measuring the appropriateness of the model.

Regression may be divided into linear regression and nonlinear regression according to the relationship between variables, and classified into simple regression, multiple regression, and higher-order regression according to the number of variables. Regression will now be described with respect to simplest simple linear regression.

When regression or a regression equation is represented by $\hat{y}=ax+\beta$, a is a gradient, a weight or a coefficient; and $\beta$ is a y-intercept, an offset, or an error. Simple linear regression is a process of finding a and $\beta$ that minimize the mean square error MSE between an actual value y and a predicted value $\hat{y}$ according to the regression equation. That is, the equation of $$MSE(a, \beta) = \frac{1}{n}\sum_{i=1}^{n}(y_i - \hat{y}_i)^2$$

represents a process of finding a and $\beta$ that minimize the mean square error MSE. In regression, the mean square error MSE is referred to as costs or a cost function.

In multiple regression with two or more independent variables x, a regression equation may be represented by $\hat{y}=a_0x_0+a_1x_1+ \ldots +a_nx_n+\beta$. In higher-order regression with a second or higher order independent variable x, a regression equation may be represented by $\hat{y}=ax^n+ \ldots +bx+c$. Similar to simple linear regression, multiple regression or higher-order regression may be performed by finding weights and offsets for minimizing MSE which is a cost function. In the overlay correcting method of the present embodiment, regression may be, for example, higher-order regression with a second or higher order independent variable x.

Over-fitting may often occur in regression. Over-fitting may be understood to mean that the generalization capability of a model is degraded due to analyzing the relationship between collected data values in more detail and complexity than necessary. Over-fitting will be described in more detail with reference to FIGS. 3A to 3C below.

After the calculation of the first correction parameters, it is determined whether the first correction parameters are greater than a scanner correction limit (S150). In other words, it is determined whether the first correction parameters, which are overlay correction parameters calculated by the regression, are within the scanner correction limit. When the first correction parameters are within the scanner correction limit, the first correction parameters may be provided to the scanner and the scanner may perform overlay correction in an exposure process, based on the first correction parameters. As a result, an overlay of a pattern formed by the exposure process of the scanner may be greatly improved.

In contrast, even when at least one of the first correction parameters is beyond the scanner correction limit, overlay correction of the scanner based on the first correction parameters may not lead to a desired result. Therefore, an overlay of a pattern formed by the exposure process of the scanner may not be improved or may be larger than that before overlay correction is performed in a worst case.

More specifically, when any one of overlay correction parameters is beyond a scanner correction limit, the scanner may skip overlay correction for the correction parameter or reduce the correction parameter to perform overlay correction within the scanner correction limit according to determined specifications. As such, when the scanner does not accurately perform overlay correction on the correction parameter, an error may be caused by not only the correction parameter but also the other correction parameters based on collinearity between the correction parameters. For example, in case that there is a collinearity relationship in which the correction parameter K7 acts as a factor suppressing the correction parameter K10 and the correction parameter K7 is corrected to be smaller than a calculated value, an error caused by the correction parameter K10 may still occur or increase even when the correction parameter K10 is corrected according to the calculated value.

Thus, when at least one of the first correction parameters is larger than the scanner correction limit (when 'Yes'), regularized regression is performed to calculate second correction parameters (S170). In the overlay correcting method of the present embodiment, the regularized regression may be one of, for example, a ridge regression, a least absolute shrinkage and selection operator (LASSO) regression, and an elastic net regression. However, the regularized regression is not limited thereto.

The regularized regression will be described in more detail. When the over-fitting described above occurs, the over-fitting may be fixed by performing regression by collecting more data, selecting a lower-order regression model or reducing variables in data, or adding regularization to a model.

There may be many types of regularization. Examples of regularization include L2 regularization, L1 regularization, drop out, max-nom regularization, data augmentation, etc. Here, the L2 regularization and the L1 regularization used in the overlay correcting method of the present embodiment will be described briefly. The L2 regularization refers to regularization used for ridge regression, and a cost function formula $(Jr(k))$ of the ridge regression may have a form in which a regularization term is added to a cost function $MSE(k)$ as expressed in Equation (1) below.

$$Jr(k) = MSE(k) + \alpha \tfrac{1}{2} \Sigma_{i=1}^{n} k_i^2 \qquad \text{Equation (1),}$$

wherein k denotes an overlay correction parameter of the n correction parameters, and a denotes a hyper-parameter for adjusting regularization strength of the ridge regression. As shown in Equation (1), when α is 0, there is no regularization and thus the ridge regression becomes the same as the linear regression. Conversely, when α is very large, weights are close to zero and thus a model may eventually be a horizontal line past a mean of data. Ridge regression in which a regularization term is represented by a square of norm is referred to as the L2 regularization. When a cost function formula of ridge regression is calculated using a partial difference equation of k, a normal equation of $k=(X^T \cdot X + \alpha A)^{-1} X^T \cdot y$ may be solved. Here, $X^T$ denotes a transpose matrix of X, $M^{-1}$ denotes an inverse matrix of M, A denotes a unit matrix, and α and y may be represented by vectors.

The L1 regularization refers to regularization used for LASSO regression, and a cost function formula $(Jl(k))$ of the LASSO regression may have a form in which a regularization term is added to a cost function $MSE(k)$ as expressed in Equation (2) below.

$$Jl(k) = MSE(k) + \alpha \Sigma_{i=1}^{n} |k_i| \qquad \text{Equation (2),}$$

wherein k denotes an overlay correction parameter, and a denotes a hyper-parameter for adjusting regularization strength of the LASSO regression. In the LASSO regression, an influence of a regularization term increases when α is increased, and the LASSO regression becomes the same as the linear regression when α is reduced to almost zero, similar to the ridge regression. Eliminating relatively less important weight is an important feature of the LASSO regression. The LASSO regression in which a regularization term is represented by a first-order norm is referred to as the L1 regularization.

The regularized regression may include, for example, elastic net regression that is a combination of ridge regression and LASSO regression. A cost function equation $(Je(k))$ of the elastic net regression may also have a form in which regularization terms are added to a cost function $MSE(k)$ as expressed in Equation (3) below.

$$Je(k) = MSE(k) + r\alpha \Sigma_{i=1}^{n} k_i^2 + (1-r)\alpha \Sigma_{i=1}^{n} |k_i| \qquad \text{Equation (3),}$$

wherein k denotes an overlay correction parameter, a denotes a hyper-parameter for adjusting regularization strength of the elastic net regression, and r denotes a mixing ratio of the ridge regression and the LASSO regression. For example, the elastic net regression is the same as the LASSO regression when r is 0 and is the same as the ridge regression when r is 1.

For reference, an environment in which the linear regression, the ridge regression, the LASSO regression, and the elastic net regression are used will be briefly described below. Use of the linear regression is avoided because use of regularized regression is preferable. Generally, the ridge regression is basically used but when it seems that only some features thereof are actually used, the LASSO regression or the elastic net regression may be used. In this case, the LASSO regression or the elastic net regression may be advantageous because weights of unnecessary features become zero as described above. When the number of features is greater than the number of pieces of data or when some features are strongly related to each other, the elastic net regression may be more advantageous than the LASSO regression.

The calculation of the second correction parameters may not be performed once by the regularized regression but be performed several times by adjusting the hyper-parameter α. In other words, the second correction parameters that are all within the correction limit of the scanner may be calculated by performing the regularized regression several times while adjusting the hyper-parameter α. The calculation of the second correction parameters (S170) will be described in more detail with reference to FIG. 1B below.

After calculation of the second correction parameters, the second correction parameters are provided to a scanner 200 (see FIG. 10A or 10B) (S190). In other words, the second correction parameters that fall within the scanner correction limit are provided to the scanner. Thereafter, the scanner may perform overlay correction in an exposure process, based on the second correction parameters.

In the determination of whether the first correction parameters are greater than the scanner correction limit (S150), when all of the first correction parameters are equal to or less than the scanner correction limit (when 'No'), the first correction parameters are provided to the scanner (S190). In other words, when all of the first correction parameters fall within the scanner correction limit, the first correction parameters may be provided to the scanner without calculating the second correction parameters by the regularized regression. Thereafter, the scanner may perform overlay correction in an exposure process, based on the first correction parameters.

Referring to FIG. 1B, in the calculation of the second correction parameters (S170), first, the hyper-parameter α is adjusted in the regularized regression (S171). As described above, regularization strength may be adjusted by adjusting the hyper-parameter α. Here, the regularized regression may be one of the ridge regression, the LASSO regression, and the elastic net regression. However, the regularized regression is not limited thereto.

After the adjustment of the hyper-parameter α, the regularized regression is performed to calculate initial second correction parameters (S173). A method of calculating initial second correction parameters by the regularized regression is as described above with reference to FIG. 1A. Then, it is determined whether the initial second correction parameters are greater than the scanner correction limit (S175).

When at least one of the initial second correction parameters is larger than the scanner correction limit (when 'Yes'), the adjustment of the hyper-parameter α (S171) is performed to adjust the hyper-parameter α and subsequent operations may be performed. That is, the regularized regression is based on the scanner correction limits. When all of the initial second correction parameters are less than the scanner correction limit (when 'No'), the initial second correction parameters are provided to the scanner as second correction parameters (S190).

In the overlay correcting method of the present embodiment, correction parameters for maximizing the correction capability of a scanner may be calculated within a scanner correction limit during calculation of overlay correction parameters by the regularized regression. Specifically, in the overlay correcting method of the present embodiment, when at least one of overlay correction parameters calculated by a general regression exceeds the scanner correction limit, overlay correction parameters may be calculated again by a regularized regression, e.g., the ridge regression, the LASSO regression, or the elastic net regression. All the overlay correction parameters calculated through such a regularized regression analysis may be equal to or less than the scanner correction limit. Therefore, the overlay correcting method of the present embodiment is capable of maximizing the overlay correction capability of a scanner, based on the overlay correction parameters equal to or less than the scanner correction limit. Accordingly, the overlay correcting method of the present embodiment is capable of maximizing the overlay correction capability of the scanner and greatly improving an overlay of patterns to be patterned, which are formed by the exposure process of the scanner.

Figure 2A:
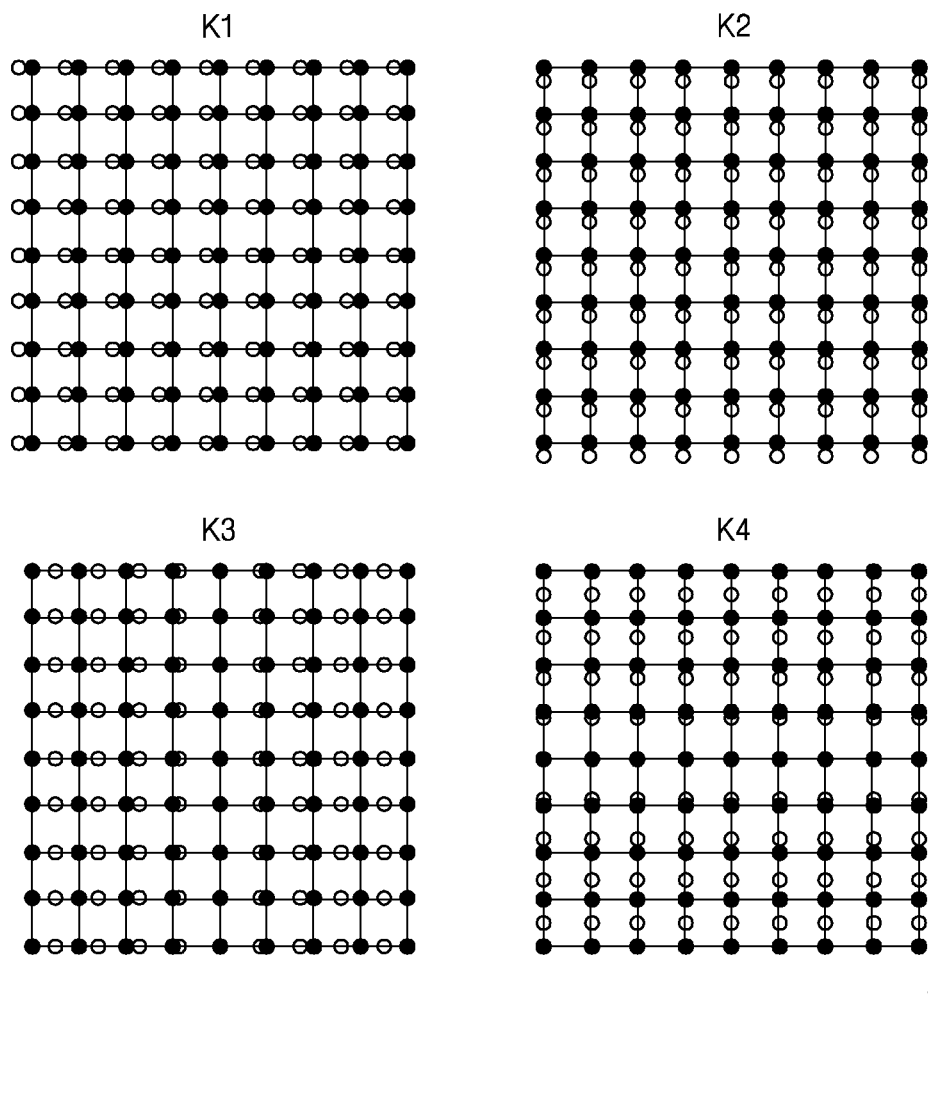

FIGS. 2A to 2C are conceptual diagrams for explaining correction parameters of an overlay. Elements or operations described above with reference to FIGS. 1A and 1B will be briefly described or omitted here.

FIG. 2A illustrates linear correction parameters which are first-order correction parameters among overlay correction parameters. In detail, upper left correction parameters K1 represent a case in which an overlay of a constant size occurs at a side in a first direction (an x-axis direction), and correction parameters K2 represent a case where an overlay of a constant size occurs at a side in a second direction (a y-axis direction). When the overlay in the first direction (the x-axis direction) is dx and the overlay in the second direction (the y-axis direction) is dy, the correction parameters K1 may be expressed in the form of dx=k1 and the correction parameters K2 may be expressed in the form of dy=k2. Here, the first direction (the x-axis direction) is a direction in which slits on the bottom of an EUV mask M (see FIG. 10B) extend, and the second direction (the y-axis direction) is a scan direction in an EUV exposure process and may be perpendicular to the first direction (the x-axis direction).

Lower left correction parameters K3 represent a case in which an overlay error of a size proportional to a position occurs at both sides in the first direction (the x-axis direction), and lower right correction parameters K4 represent a case in which an overlay error of a size proportional to a position occurs at both sides in the second direction (the y-axis direction). Accordingly, the correction parameters K3 may be represented in the form of dx=k3*x and the correction parameters K4 may be represented in the form of dy=k4*y.

There may be correction parameters K5 represented by dx=k5*y and correction parameters K6 represented by dy=k6*x as linear correction parameters other than the correction parameters K1 to K4.

FIG. 2B illustrates correction parameters which are second-order correction parameters among overlay correction parameters. In detail, left correction parameters K7 represent a case in which an overlay error of a size proportional to the square of a position occurs at both sides in the first direction (the x-axis direction), and right correction parameters K8 represent a case in which an overlay error of a size proportional to the square of a position occurs at both sides in the second direction (the y-axis direction). Accordingly, the correction parameters K7 may be represented in the form of $dx=k7*x^2$ and the correction parameters K8 may be represented in the form of $dy=k8*y^2$.

There may be correction parameters K9 represented by dx=k9*x*y, correction parameters K10 represented by dy=k10*y*x, correction parameters K11 represented by $dx=k11*y^2$, and correction parameters K12 represented by $dy=k12*x^2$ as second-order correction parameters other than the correction parameters K7 and K8.

FIG. 2C illustrates correction parameters which are third-order correction parameters among overlay correction parameters. In detail, left correction parameters K13 represent a case in which an overlay error of a size proportional to the cube of a position occurs at both sides in the first direction (the x-axis direction), and right correction parameters K14 represent a case in which an overlay error of a size proportional to the cube of a position occurs at both sides in the second direction (the y-axis direction). Accordingly, the correction parameters K13 may be represented in the form of $dx=k13*x^3$ and the correction parameters K14 may be represented in the form of $dy=k14*y^3$.

There may be correction parameters K15 represented by $dx=k15*x^2*y$, correction parameters K16 represented by $dy=k16*y^2*x$, correction parameters K17 represented by $dx=k17*x*y^2$, correction parameters K18 represented by $dy=k18*y*x^2$, correction parameters K19 represented by $dx=k19*y^3$, and correction parameters K20 represented by $dy=k20*x^3$, as the third-order correction parameters other than the correction parameters K13 and K14.

As described above, a scanner correction limit may vary depending on correction parameters. In the case of the linear correction parameters K1 to K6, a correction limit of an EUV scanner is 1000 nm or more per cm and thus may be considered as limitless. In other words, the correction parameters K1 to K6 calculated by regression (e.g., general regression) fall within the scanner correction limit and thus there is no need to consider regularized regression. Among the second or third order correction parameters, a correction limit of the correction parameters K8, K10, K11, K14, K16, K19, etc. is about 1000 nm per $cm^2$ or $cm^3$ and thus there is no need to consider the correction limit. A scanner correction limit of remaining higher-order correction parameters is about 10 nm per $cm^2$ or $cm^3$ and thus correction parameters calculated by regression may be compared with the scanner correction limit and calculated again by regularized regression when the correction parameters calculated by regression are beyond the scanner correction limit.

Although the EUV scanner has been described above, in the case of an immersion scanner or an extended scanner, some of higher-order correction parameters have a very small correction limit and thus regularized regression may be performed to calculate correction parameters falling within the correction limit, similar to the EUV scanner.

Figure 3A:
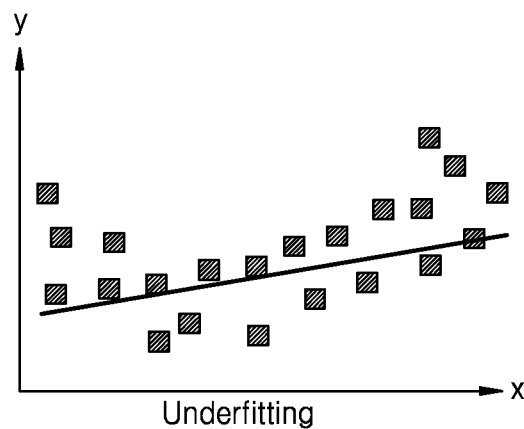
FIGS. 3A, 3B, and 3C are graphs for explaining a concept of fitting a model obtained by regression.
Figure 3B:
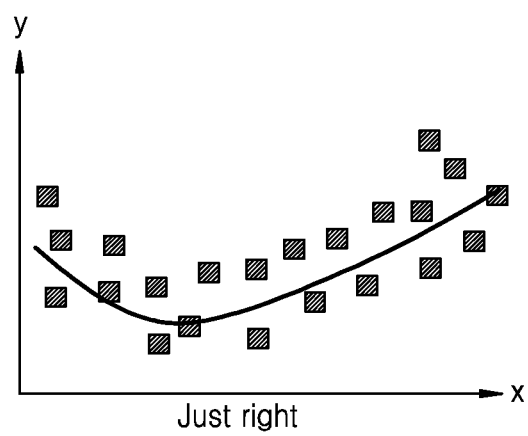
Figure 3C:
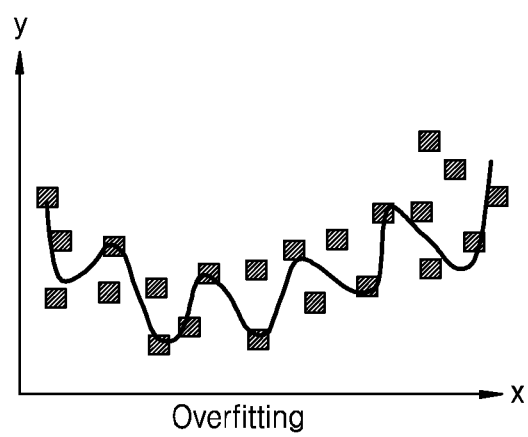

FIGS. 3A to 3C are graphs for explaining a concept of fitting a model obtained by regression. Elements or operations described above with reference to FIGS. 1A to 2C will be briefly described or omitted here.

Referring to FIG. 3A, although a linear regression model as close as possible to data is obtained by regression, a value of a cost function may be relatively large. Such a regression model is called underfitting or an underfitted model. Underfitting may be caused by selection of an extremely low-order regression model. Underfitting may be fixed by choosing a higher-level regression model, reducing constraints of a regression model, or learning enough until overfitting occurs.

FIG. 3B illustrates a case in which a just right regression model is obtained by regression by selecting a curved regression model, e.g., a regression model of a quadratic curve. A value of a cost function is greatly reduced compared to that when α linear regression model is obtained. As a result, as a higher-order regression model is selected, i.e., as the number of weights is increased, a regression model that better accounts for data may be obtained. Here, each of the weights may be a coefficient of one of orders in other words.

FIG. 3C illustrates a regression model obtained by regression by selecting a very high-order curved regression model. The regression model may accurately account for all data used in the regression and a value of a cost function may be nearly zero. However, such a regression model is not general and thus other data will not be accurately predicted using this model. As described above, a regression model including excessive weights to account for collected data accurately is referred to as overfitting or an overfitted model. A method of fixing or correcting the overfitting has been described above.

An overlay correcting method of the present embodiment may be based on a principle that correction parameters are obtained by regression (e.g., general regression, which may be independent of scanner correction limits) but when some of the obtained correction parameters, e.g., higher-order correction parameters, are beyond a scanner correction limit, higher-order correction parameters falling within the scanner correction limit may be calculated by adding a regularization term, similar to the method of fixing overfitting.

FIGS. 4A to 4D are graphs for explaining measured overlays and various overlay correcting methods. Here, an x-axis and a y-axis represent positions. Elements or operations described above with reference to FIGS. 1A to 3C will be briefly described or omitted here.

Referring to FIGS. 4A to 4D, FIG. 4A is a graph showing an overlay actually measured, for example, an overlay of an edge portion of a wafer to be patterned. Ideal overlay correction is to correct all measured overlays but may not actually be impossible for many reasons. Accordingly, generally, correction parameters of an overlay may be calculated by regression and the overlay may be corrected by a scanner, based on the correction parameters. However, as described above, a problem may occur when the correction parameters of the overlay calculated by regression are beyond a scanner correction limit.

Figure 4A:
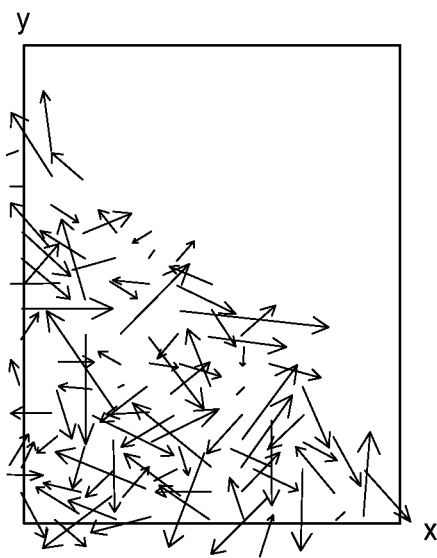
FIGS. 4A, 4B, 4C, and 4D are graphs for explaining measured overlays and various overlay correcting methods.
Figure 4B:

FIG. 4B illustrates a case cut out in which a scanner performs overlay correction, based on correction parameters of an overlay, and when α correction parameter exceeds a scanner correction limit, the correction parameter is reduced to be corrected within the correction limit and an excess portion is cut out. In the correcting method, a problem may occur due to a collinearity relationship between the correction parameters as described above.

Figure 4C:
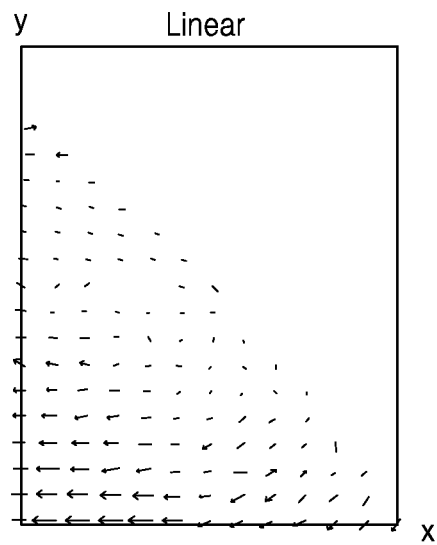
Figure 4D:
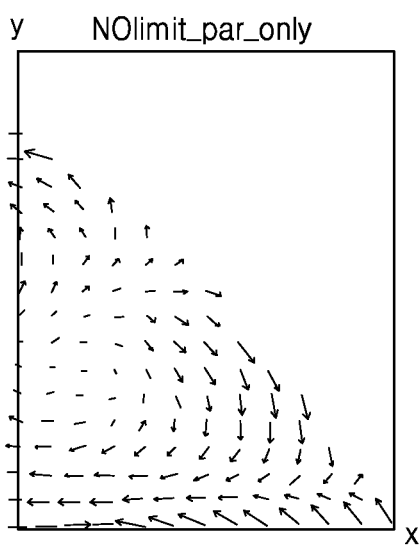

FIG. 4C illustrates a case linear in which a scanner performs overlay correction based only on linear correction parameters without performing overlay correction on higher-order correction parameters. FIG. 4D illustrates a case nolimitpar only in which a scanner performs overlay correction based only on correction parameters with a very large correction limit of 1000 nm or more as described above with respect to a correction limit of an EUV scanner.

The overlay correcting methods of FIGS. 4B to 4D may not be considered preferable because certain correction parameters may be simply excluded or reduced without a reasonable basis. Furthermore, an overlay may still occur or may occur in a different form in a pattern actually formed by performing overlay correction by a scanner.

Figure 5A:
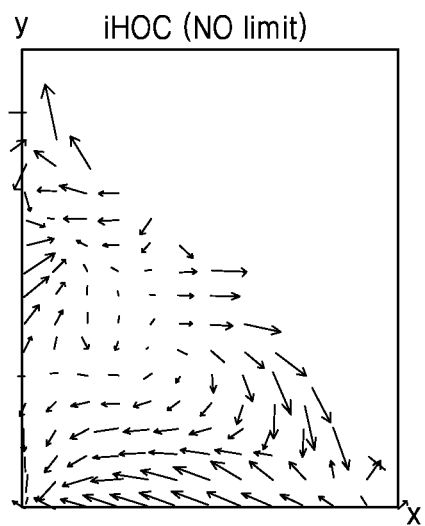
FIGS. 5A and 5B are graphs for explaining an overlay correcting method when a scanner correction limit is not considered with respect to the overlay of FIG. 4A, and an overlay correction method according to an embodiment.
Figure 5B:
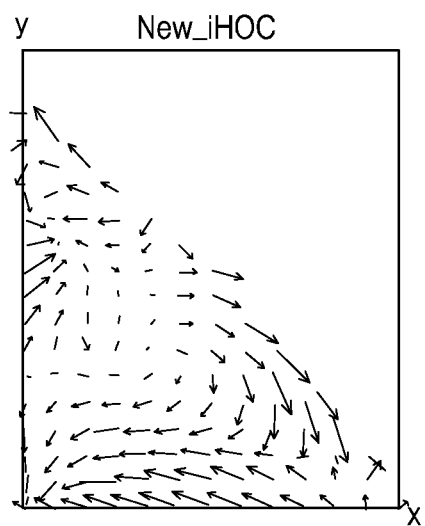

FIGS. 5A and 5B are graphs for explaining an overlay correcting method when α correction limit of a scanner is not considered with respect to the overlay of FIG. 4A, and an overlay correcting method according to an embodiment, respectively. Here, an x-axis and a y-axis represent positions. Elements or operations described above with reference to FIGS. 1A to 4C will be briefly described or omitted here.

FIG. 5A illustrates a case iHOC (no limit) in which a scanner performs overlay correction without considering a scanner correction limit, based on correction parameters obtained by regression. In other words, this case is an ideal case in which there is no scanner correction limit and thus the scanner performs overlay correction by reflecting all correction parameters. However, actually, the scanner has a correction limit for some higher-order correction parameters as described above.

FIG. 5B illustrates a case New_iHOC in which a scanner performs overlay correction based on correction parameters obtained by an overlay correcting method according to the present embodiment. As described above, in the overlay correcting method of the present embodiment, regularized regression may be additionally performed based on scanner correction limits to calculate correction parameters that maximize overlay correction capability of the scanner within a scanner correction limit, e.g., in combination with or responsive to an initial regression that is performed independent of the scanner correction limits. In addition, the scanner may optimally perform overlay correction based on these correction parameters and thus an overlay of a pattern formed by the scanner may be greatly improved.

Figure 6A:
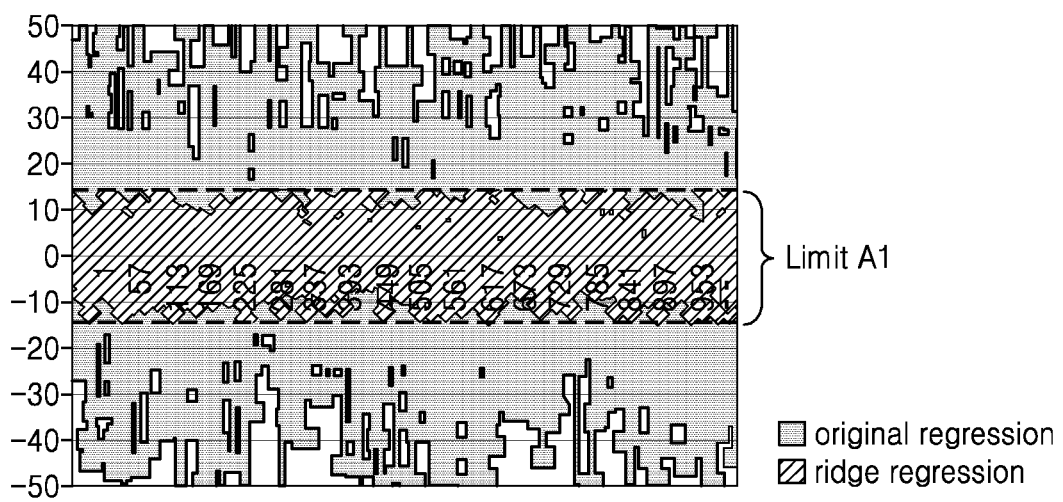
FIGS. 6A and 6B are graphs illustrating a concept of adjusting a hyper-parameter α in an overlay correcting method according to an embodiment, so that an overlay correction parameter is included within a correction limit of a scanner.
Figure 6B:
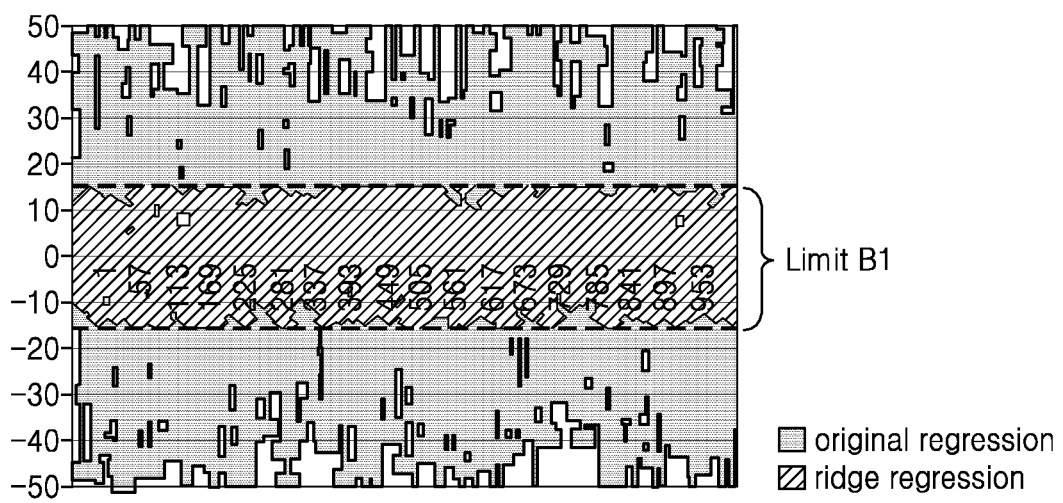

FIGS. 6A and 6B are graphs illustrating a concept of adjusting a hyper-parameter a in an overlay correcting method according to an embodiment, so that a correction parameter of an overlay is included within a correction limit of a scanner. Here, an x-axis represents selected points and an y-axis represents a size of a correction parameter. Elements or operations described above with reference to FIGS. 1A to 5B will be briefly described or omitted here.

In FIGS. 6A and 6B, it is assumed that a correction limit of each scanner is indicated by a dotted line. For example, the dotted line of FIG. 6A represents a correction limit A1 of a scanner A, the dotted line of FIG. 6B represents a correction limit B1 of a scanner B. For example, the correction limit B1 may be greater than the correction limit A1.

FIG. 6A illustrates that in the overlay correcting method of the present embodiment, when a hyper-parameter $\alpha 1$ is applied to the regularization term of the ridge regression, a certain correction parameter may be calculated at each point within the correction limit A1 of the scanner A. In other words, a certain correction parameter (a shadow-hatched portion) calculated at each point by original regression may exceed the correction limit A1 of the scanner A. In contrast, in the overlay correcting method of the present embodiment, a certain correction parameter (a cross- or slash-hatched portion) calculated by the ridge regression may converge within the correction limit A1 of the scanner A.

Similar to FIG. 6A, FIG. 6B illustrates that in the overlay correcting method of the present embodiment, when a hyper-parameter $\alpha 2$ is applied to the regularization term of the ridge regression, a certain correction parameter may be calculated at each point within the correction limit B1 of the scanner B.

For reference, an effect of suppressing correction parameters may be increased when $\alpha$ hyper-parameter $\alpha$ is increased, and reduced when the hyper-parameter $\alpha$ is reduced. For example, when the hyper-parameter $\alpha$ is set to 0, the effect of suppressing the correction parameters may be diminished and thus the ridge regression may become the same as general regression. Conversely, when the hyper-parameter $\alpha$ is increased, the effect of suppressing the correction parameters may be increased, and unimportant correction parameters may be removed in the case of the LASSO regression.

Figure 7:
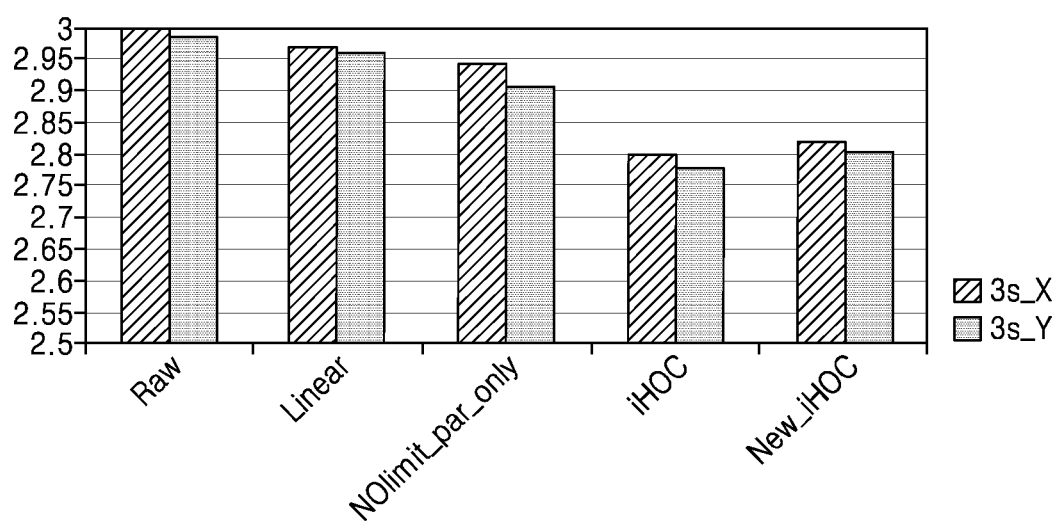
FIG. 7 shows 3-sigma graphs of the overlays illustrated in FIGS. 4A, 4C, 4D, 5A, and 5B.

FIG. 7 shows 3-sigma graphs of the overlays illustrated in FIGS. 4A, 4C, 4D, 5A, and 5B. Elements or operations described above with reference to FIGS. 1A to 6B will be briefly described or omitted here.

Referring to FIG. 7, the leftmost graph is a 3-sigma graph showing a case in which overlay correction was not performed, which may correspond to FIG. 4A. The second graph from the left is a 3-sigma graph showing a case in which overlay correction is performed based on only linear correction parameters, which may correspond to FIG. 4C. The third graph from the left is a 3-sigma graph showing a case in which overlay correction is performed based on only correction parameters with a very large correction limit of 1000 nm or more, which may correspond to FIG. 4D. The second graph from the right is a 3-sigma graph showing a case in which overlay correction is performed based on all correction parameters without considering a scanner correction limit, and may correspond to FIG. 5A. Finally, the rightmost graph is a 3-sigma graph showing a case in which overlay correction was performed based on correction parameters obtained by the overlay correcting method of the present embodiment, and may correspond to FIG. 5B.

FIG. 7 illustrates that 3 sigma of the overlay correction based on the correction parameters obtained by the overlay correcting method of the present embodiment is closest to 3 sigma of the overlay correction of FIG. 5A, which is ideal overlay correction performed without considering a scanner correction limit.

Figure 8A:
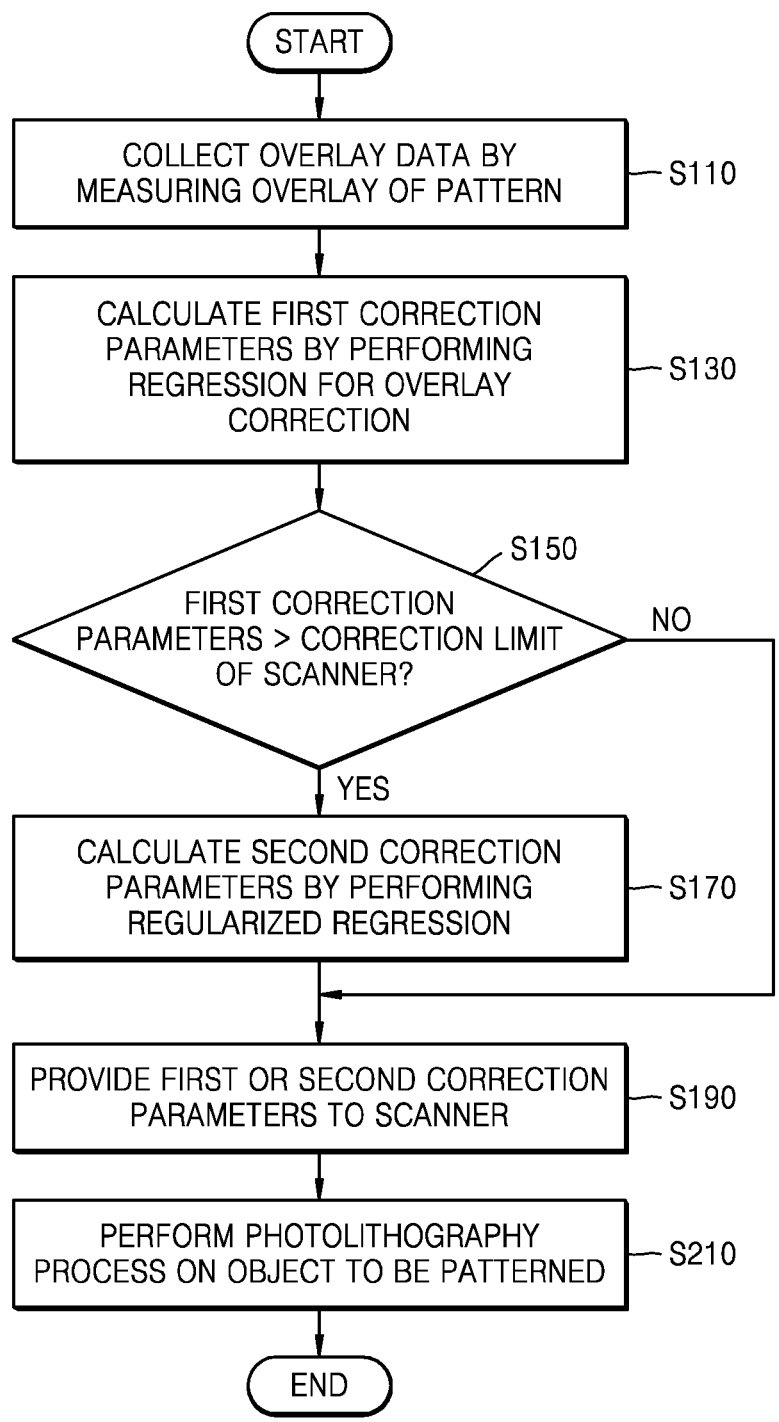
FIG. 8A is a flowchart of a photolithography method according to an embodiment of the inventive concept.
Figure 8B:
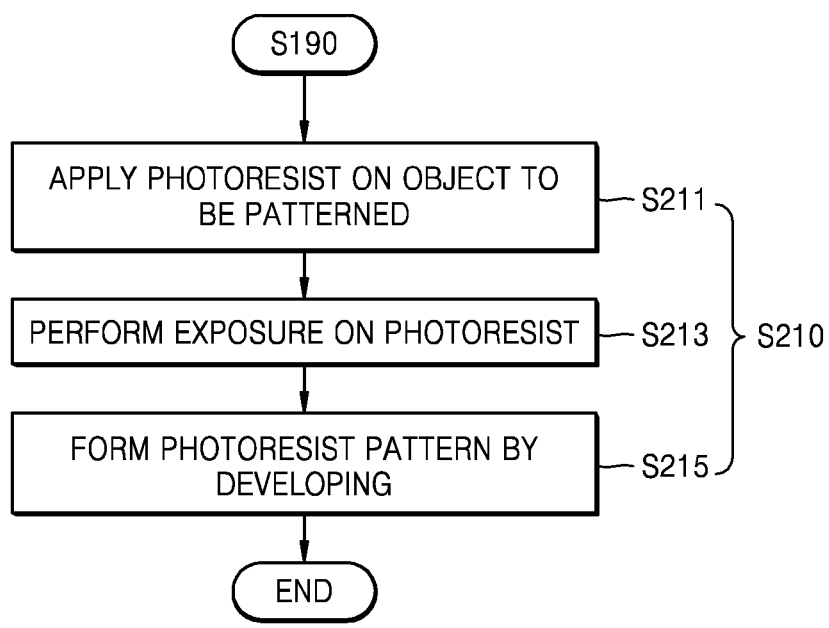
FIG. 8B is a flowchart illustrating a photolithography process of FIG. 8A in more detail.

FIG. 8A is a flowchart of a photolithography method according to an embodiment of the inventive concepts. FIG. 8B is a flowchart illustrating performing a photolithography process of FIG. 8A in more detail. Elements or operations described above with reference to FIGS. 1A to 7 will be briefly described or omitted here.

Referring to FIG. 8A, in the photolithography method of the present embodiment, an operation of collecting overlay data (S110) to an operation of providing first or second correction parameters to a scanner (S190) are sequentially performed. Details of the above operations are as described above with reference to FIGS. 1A and 1B.

Thereafter, the scanner 200 (see FIG. 10B) performs a photolithography process on the object W (see FIG. 10B) to be patterned (S210). Here, the scanner 200 may perform overlay correction in the photolithography process, based on first or second correction parameters. The photolithography process may include several operations as described with reference to FIG. 8B below.

Referring to FIG. 8B, in the photolithography process, first, a photoresist (PR), e.g., a PR for EUV, is applied onto the object W to be patterned (S211). The PR may be applied on the object W to be patterned, for example, by spin coating.

After the application of the PR, exposure is performed on the PR by the scanner 200 (see FIG. 10B) (S213). The scanner 200 may be an EUV scanner and the PR may be a PR for EUV. The scanner may perform overlay correction in the exposure process, based on first or second correction parameters. The chemical properties of the PR are changed by the exposure. Due to the change of the chemical properties of the PR, an exposed or non-exposed portion thereof may be removed by development performed later.

After the exposure of the PR, a PR pattern is formed by development (S215). In general, a baking process may be further performed before a developing process. In the developing process, the exposed or non-exposed portion of the PR may be removed a certain time after a developing solution is sprayed onto the PR or the PR is dipped into the developing solution and a wafer is rotated to evenly spread the developing solution. Thereafter, a cleaning process and the baking process may be further performed.

FIG. 9 is a flowchart of a semiconductor device manufacturing method according to an embodiment of the inventive concepts. Elements or operations described above with reference to FIGS. 8A and 8B will be briefly described or omitted here.

Referring to FIG. 9, in the semiconductor device manufacturing method of the present embodiment, an operation of collecting overlay data (S110) to an operation of performing a photolithography process on an object to be patterned (S210) is sequentially performed. Details of the above operations are as described above with reference to FIGS. 1A, 1B, 8A, and 8B.

Thereafter, a pattern is formed on the object W (see FIG. 10B) to be patterned (S230). The pattern of the object W to be patterned may be formed by an etching process using a PR pattern formed by the photolithography process as an etching mask. The etching processes may be largely divided into dry etching and wet etching.

After the pattern is formed on the object W to be patterned, a subsequent semiconductor process is performed on the object W to be patterned (S250). A semiconductor device may be manufactured by performing a subsequent semiconductor process on the object W to be patterned. For example, when the object W to be patterned is a wafer, the subsequent semiconductor process may be performed on the wafer to manufacture a plurality of semiconductor devices from the wafer.

The subsequent semiconductor process performed on the wafer may include various processes. For example, the subsequent semiconductor process performed on the wafer may include a deposition process, an etching process, an ion process, a cleaning process, or the like. The subsequent semiconductor process performed on the wafer may further include testing the semiconductor devices at a wafer level. The subsequent semiconductor process performed on the wafer may further include a process of individualizing the wafer into semiconductor chips and a process of packaging the semiconductor chips. Here, the packaging process refers to a process of mounting the semiconductor chips on a printed circuit board (PCB) and sealing the semiconductor chips with a sealing material, and may include forming a stacked package by stacking a plurality of semiconductors in multiple layers on the PCB or forming a package-on-package (POP) structure by stacking a stacked package on the stacked package. A semiconductor device or a semiconductor package may be completed by the packaging process of the semiconductor chips.

Figure 10A:
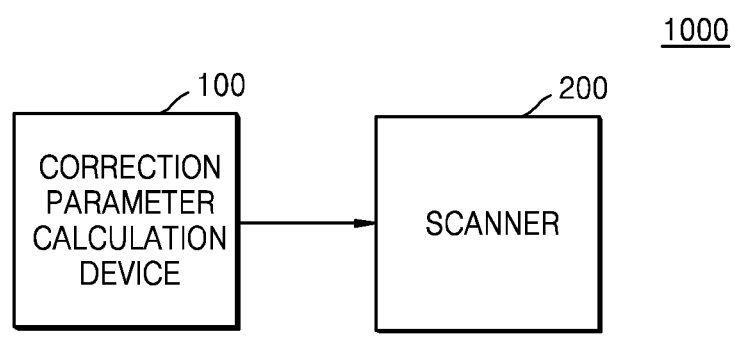
FIG. 10A is a block diagram of a scanner system according to an embodiment of the inventive concept.
Figure 10B:
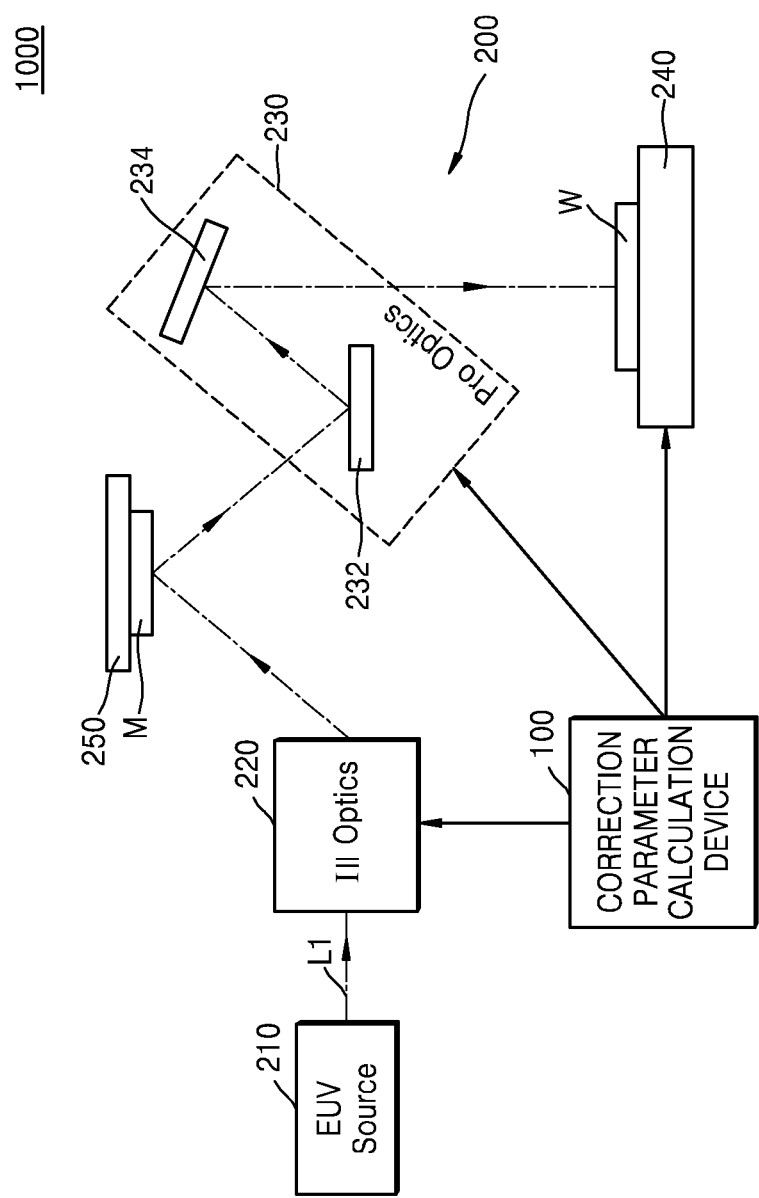
FIG. 10B is a block diagram of the scanner of FIG. 10A in more detail.

FIG. 10A is a block diagram of a scanner system according to an embodiment of the inventive concepts. FIG. 10B is a block diagram of the scanner of FIG. 10A in more detail. Elements or operations described above with reference to FIGS. 1A to 9 will be briefly described or omitted here.

Referring to FIGS. 10A and 10B, a scanner system 1000 of the present embodiment may include a correction parameter calculation device 100 and the scanner 200.

The correction parameter calculation device 100 may calculate overlay correction parameters by regression or regularized regression. The correction parameter calculation device 100 may calculate overlay correction parameters through various operation as described above with reference to FIGS. 1A and 1B. For example, the correction parameter calculation device 100 may calculate correction parameters by performing regression based on input overlay data, determine whether the correction parameters are greater than a correction limit of the scanner 200, and calculate new correction parameters by performing regularized regression when at least one of the correction parameters is greater than the correction limit of the scanner 200. The regularized regression may be, for example, one of the ridge regression, the LASSO regression, and the elastic net regression. However, the regularized regression is not limited thereto.

The overlay data may be measured and collected by a measurement device (not shown). The collected overlay data may be automatically or manually input to the correction parameter calculation device 100. For example, the correction parameter calculation device 100 may be embodied as either an automatic process control (APC) device configured to be operated while the overlay data is automatically input thereto or an offline tool such as a personal computer configured to be operated while the overlay data is manually input thereto by a user. When the correction parameter calculation device 100 is embodied as the APC device, the calculated correction parameters may be automatically input to the scanner 200. When the correction parameter calculation device 100 is embodied as the offline tool, the calculated correction parameters may be manually input to the scanner 200 by a user or the offline tool may be connected to the scanner 200 so that a result processed by the offline tool may be automatically input to the scanner 200.

The scanner 200 may be an EUV scanner. However, the scanner 200 is not limited to the EUV scanner. For example, the scanner 200 may be an immersion scanner or an extended scanner. For convenience of explanation, the following description will focus on the EUV scanner. The scanner 200 may include an EUV light source 210, an illumination optical system 220, a projection optical system 230, a stage 240, and a mask support 250.

The EUV light source 210 may generate and output EUV L1 having a high energy density within a wavelength range of about 5 nm to 50 nm. For example, the EUV light source 210 may generate and output a high-energy-density EUV L1 having a wavelength of 13.5 nm. The EUV light source 210 may be a plasma-based light source or a synchrotron radiation light source. Here, the plasma-based light source refers to a light source that generates plasma and uses light emitted by the plasma, and includes a laser-produced plasma (LPP) light source or a discharge-produced plasma (DPP) light source. In the scanner system 1000 of the present embodiment, the EUV light source 210 of the scanner 200 may be, for example, the plasma-based light source. However, in the scanner system 1000 of the present embodiment, the EUV light source 210 of the scanner 200 is not limited to the plasma-based light source. The plasma-based light source may include a condensing mirror such as an elliptical mirror and/or a spherical mirror that concentrates EUV to increase the energy density of illumination light incident on the illumination optical system 220.

The illumination optical system 220 may include a plurality of mirrors, and transmit the EUV L1 from the EUV light source 210 to an EUV mask M on the mask support 250. For example, the EUV L1 from the EUV light source 210 may be reflected by the mirrors of the illumination optical system 220 to be incident on the EUV mask M on the mask support 250.

The EUV mask M may be a reflective mask having a reflective region and a non-reflective region and/or an intermediate reflective region. The EUV mask M may include a reflective multi-layer film provided on a substrate formed of a low thermal expansion coefficient material (LTEM) such as quartz to reflect EUV, and an absorption layer pattern formed on the reflective multi-layer film. The reflective multi-layer film may have a structure in which a molybdenum (Mo) layer and a silicon (Si) layer are alternately stacked in several tens or more layers. The absorption layer may be formed of, for example, TaN, TaNO, TaBO, Ni, Au, Ag, C, Te, Pt, Pd, Cr, or the like. However, the material of the reflective multi-layer film and the material of the absorption layer are not limited to the above materials. Here, the absorption layer may correspond to the non-reflective region and/or the intermediate reflective region.

The EUV mask M may reflect the EUV L1 incident thereon via the illumination optical system 220 to be incident on the projection optical system 230. In more detail, the EUV mask M may structurize illumination light from the illumination optical system 220 into projection light to be incident on the projection optical system 230, based on the pattern formed on the substrate and consisting of the reflective multi-layer film and the absorption layer. The projection light may be structurized through a second or higher order of diffraction due to the pattern on the EUV mask M. The projection light may be incident on the projection optical system 230 while retaining shape information of the pattern on the EUV mask M and may pass through the projection optical system 230 to transfer an image corresponding to the pattern of the EUV mask M onto the object W to be patterned.

The object W to be patterned may be a substrate, e.g., a wafer, containing a semiconductor material such as silicon. Hereinafter, the object W to be patterned and the wafer will be considered as the same unless specifically necessary to distinguish therebetween and thus the reference numeral 'W' is also used for the wafer. In addition, an object to be exposed to the projection light may be the PR applied on the object W to be patterned.

The object W to be patterned may be disposed on the stage 240. The stage 240 may be moved on an x-y plane in not only an x-axis direction and a y-axis direction but also in a z-axis direction perpendicular to the x-y plane. Accordingly, the object W to be patterned may be also moved in the x-axis direction, the y-axis direction, and the z-axis direction by moving the stage 240.

The projection optical system 230 may include a plurality of mirrors. Although FIG. 10B illustrates only two mirrors, i.e., a first mirror 232 and a second mirror 234, included in the projection optical system 230 for convenience of explanation, the projection optical system 230 may include more than two mirrors. For example, generally, the projection optical system 230 may include four to eight mirrors. However, the number of mirrors that may be included in the projection optical system 230 is not limited thereto.

The scanner system 1000 of the present embodiment may include the correction parameter calculation device 100 capable of calculating correction parameters of an overlay by regression or regularized regression. Accordingly, in the scanner system 1000 of the present embodiment, correction parameters that maximize the correction ability of the scanner 200 within the correction limit of the scanner 200 may be calculated by the correction parameter calculation device 100, and the scanner 200 may perform overlay correction based on the correction parameters, thereby optimizing the overlay correction. As a result, in the scanner system 1000 of the present embodiment, the scanner 200 may perform exposure on an object to be patterned, based on the correction parameters calculated by the correction parameter calculation device 100 and thus an overlay of a pattern formed on the object to be patterned may be greatly improved.

While the inventive concepts have been described above with reference to the embodiments illustrated in the drawings, these embodiments are merely examples and it will be understood by those of ordinary skill in the art that various modifications and equivalent other embodiments may be made. Therefore, the technical scope of the inventive concepts should be defined by the technical idea of the appended claims.

What is claimed is:

1. A scanner system comprising:
a correction parameter calculation device configured to calculate correction parameters of an overlay by regularized regression; and
a scanner configured to perform a photolithography process on an object to be patterned, based on the correction parameters, wherein the regularized regression is based on a correction limit of the scanner.

2. The scanner system of claim 1, wherein
the correction parameter calculation device comprises an automatic process control (APC) device configured to be operated while data is automatically input thereto or an offline tool configured to be operated while data is input thereto by a user.

3. The scanner system of claim 1, wherein
the correction parameter calculation device is further configured to,
before the regularized regression is performed, determine whether pre-correction parameters obtained by a first regression using overlay data obtained by measuring an overlay of a pattern are greater than the correction limit of the scanner, and perform the regularized regression using the overlay data responsive to determining that at least one of the pre-correction parameters is greater than the correction limit of the scanner, and
wherein the regularized regression is performed until all the correction parameters become less than or equal to the correction limit of the scanner.

4. The scanner system of claim 1, wherein
the correction parameters comprise second or higher order correction parameters, and
the regularized regression comprises one of ridge regression, least absolute shrinkage and selection operator (LASSO) regression, or elastic net regression.

5. The scanner system of claim 1, wherein
a cost function formula of the regularized regression comprises a regularization term added to a cost function term,
wherein the cost function term is MSE(k) representing an average square error related to the correction parameters, and
the regularization term comprises a term included in one of ridge regression, least absolute shrinkage and selection operator (LASSO) regression, or elastic net regression.

* * * * *